United States Patent [19]

Dietl et al.

[11] 4,234,630

[45] Nov. 18, 1980

[54] PROCESS FOR THE PROTECTION OF CARBON BODIES

[75] Inventors: Josef Dietl, Munich; Michael Wohlschläger, Unterpfaffenhofen, both of Fed. Rep. of Germany

[73] Assignee: Consortium für Elektrochemische Industrie GmbH, Munich, Fed. Rep. of Germany

[21] Appl. No.: 65,818

[22] Filed: Aug. 13, 1979

[30] Foreign Application Priority Data

Oct. 19, 1978 [DE] Fed. Rep. of Germany ........ 2845459

[51] Int. Cl.$^2$ ............................................... A23L 1/28
[52] U.S. Cl. ..................................... 427/431; 432/264; 106/38.27; 428/408; 266/280; 427/133; 65/26; 156/DIG. 83
[58] Field of Search ...................... 266/242, 275, 280; 432/264; 65/26; 106/38.27; 128/408; 156/DIG. 83; 422/248, 249

[56] References Cited

U.S. PATENT DOCUMENTS

| | | | |
|---|---|---|---|
| 1,948,382 | 2/1934 | Johnson | 428/408 |
| 2,597,963 | 5/1952 | Wenter | 428/408 |
| 3,191,852 | 6/1965 | Kaatz | 428/408 |

*Primary Examiner*—Sam Silverberg
*Attorney, Agent, or Firm*—Allison C. Collard; Thomas M. Galgano

[57] ABSTRACT

A process for protecting carbon bodies against attack by molten silicon by applying a separating protective layer is provided which is characterized in that a separating layer is applied to the surface of the carbon body to be protected in such a manner as to wet it. The separating layer consists of alkaline earth metal fluorides in admixture with 0 to 90 mole % of alkaline earth metal silicates having a melting point lower than that of silicon.

5 Claims, No Drawings

PROCESS FOR THE PROTECTION OF CARBON BODIES

The present invention relates to a process for protecting carbon bodies against attack by molten silicon by applying a separating protective layer.

Carbon mold members, and especially graphite mold members, are widely used in the art for high temperature processes because of their excellent heat durability. While graphite crucibles may be used, for example, for crucible pulling germanium according to the Czochralski technique, this is not possible in the crucible pulling of silicon. This is because at the high temperatures occurring in this process, the silicon melt attacks the graphite crucible to form silicon carbide. When manufacturing high-purity silicon for electrical components, direct contact between the silicon and the carbon should be avoided, because the carbon becomes concentrated in the silicon and this would lead to leakage currents in finished electrical components made from this type of material. For these reasons, when crucible pulling silicon, crucibles of quartz or quartz glass are used, which are considerably more expensive; but although they too can as a rule be used only once, they fracture only when the residual silicon in the crucible solidifies and not during the pulling process as is the case when using carbon or graphite crucibles.

A process for the production of shaped silicon articles, in which silicon is melted down in a carbon body, is known from DE-OS No. 20 09 459. In this process, the hollow mold of carbon must be cooled. Furthermore, the surface coming into contact with the silicon must be covered with a mold member of sintered quartz wool and/or sintered quartz sand. The silicon itself is melted in the mold by means of inductive heating and subsequently cooled by lowering it out of the inductively heated area. However, here too, problems can arise in the case of larger shaped silicon articles. In particular, since the melted silicon must remain in the prepared melting mold for a long time until all the silicon has melted, the protective layer of sintered quartz wool and/or quartz sand is destroyed. Moreover, the manufacture of a liquid-cooled mold is rather expensive. Protecting such hollow molds of graphite, the surface of which is coated with sintered quartz wool, sintered quartz sand or sintered silicon nitride, is at best only satisfactory when liquid silicon is not melted in the mold but is simply poured into it and solidified immediately by corresponding cooling of the mold (see in this connection, for example, DE-PS No. 22 44 211).

It is also known from U.S. Pat. No. 2,992,127 to render graphite crucibles resistant to oxidation processes, and especially to attack by molten silicon, by covering the surface of the graphite body with pulverulent silicon, which, when the graphite body is heated to above 1360° C. in an inert gas atmosphere, reacts on the surface to form a cohesive layer of silicon carbide. In accordance with this process, there can be a second step in which, in addition, silicon nitride is also applied in pulverulent form and sintered together with the mold member at elevated temperature. The disadvantage of this process, however, is that curved carbon mold members cannot be covered with a uniformly thick layer of silicon carbide or silicon nitride. Another disadvantage is that these sintering processes produce only a surface layer having a very poor pore density. With time, the molten silicon penetrates into these pores and attacks the graphite body underneath and decomposes it. Moreover, carbon can conversely escape from the graphite body through pores in the covering layer and penetrate into the silicon melt as an undesirable impurity. Thus, it will also penetrate at least partially into the silicon rod that is pulled from this melt.

Finally, it is known from U.S. Pat. No. 3,871,872 to protect graphite stirrers that are immersed in liquid metal baths, by coating them with alkaline earth metal alumosilicates. However, if, for example, mold members of carbon (which are not claimed in the U.S. patent) were to be coated with such a layer of alkaline earth metal alumosilicate, the shaped silicon article obtained by casting could not easily be released from the mold member after solidifying below its melting point, because the alkaline earth metal alumosilicates mentioned in this U.S. patent have a melting point above that of silicon. In this case, it would be possible to prevent contact between the molten silicon and the carbon, but not, however, the destruction of the crucible on cooling and separating the mold and the molded article.

The problem underlying the invention was therefore to provide a protective layer for carbon bodies, which protects the surface against attack by molten silicon and makes it possible to remove solidified silicon from carbon mold members that are coated in this manner without the mold being destroyed, thus allowing the mold to be used several times.

This problem is solved in accordance with the present invention in that a separating layer consisting of alkaline earth metal fluorides in admixture with 0 to 90 mole % of alkaline earth metal silicates having a melting point lower than that of silicon is applied to the surface of the carbon body to be protected in such a manner as to wet it. In accordance with the invention, the fluorides and, if applicable, the silicates of the alkaline earth metals magnesium, calcium, strontium and barium are used, wherein calcium and magnesium compounds are preferred solely because of their lower cost. The alkaline earth metal fluorides can be used individually, in admixture with other alkaline earth metal fluorides, or in admixture with alkaline earth metal silicates in the quantities given above. Mixtures of calcium fluoride and magnesium fluoride, in which the melting point can be reduced to 950° C. (when there is 45 mole % of magnesium fluoride in the mixture), by altering the mixture proportions, are, for example, suitable. Also suitable are mixtures of magnesium fluoride with calcium silicate, or of magnesium fluoride with magnesium silicate, mixtures of calcium fluoride with magnesium silicate, and, preferably, mixtures of calcium fluoride with calcium silicate, especially because calcium fluoride has a considerably lower vapor pressure than does magnesium fluoride.

Advantageously, a separating layer of the mentioned melts is applied to the carbon body to be protected in a thickness of 0.01 to 2 mm, preferably 0.1 to 0.5 mm. In order to be able to apply a layer of this thickness, the carbon parts must be wetted by the protective melt. This wetting can be achieved in the case of mixed fluoride/silicate melts, for example, by an excess of silica ($SiO_2$) of approximately 10% or more, calculated on the stoichiometric composition of the alkaline earth metal silicate ($MO.SiO_2$, M=alkaline earth metal atom), the upper limit being determined by the fact that the addition of silica produces a layer with a higher melting point and, on the other hand, the separating layer should by definition still be liquid at the melting point of silicon. A further method of achieving the wetting of the separating layer and the carbon body, is by heating the mixture prepared for the separating layer comprising alkaline earth metal fluorides and alkaline earth metal silicates to a temperature above 1600° C. when it is applied to the carbon bodies.

The third and preferably used method is by adding elemental silicon to the protective melt in quantities of above 2% by weight, preferably approximately 2 to 5% by weight. This method may be used both in pure fluoride melts and in mixed fluoride/silicate melts.

The carbon bodies may be coated by various methods, for example, by applying and melting pulverulent layers, wherein the individual constituents of the mixture to be used for the layer are mixed together in solid pulverulent form and scattered as uniformly as possible over the surface of the carbon body to be protected. A further possibility is to melt the mixture provided for the protective layer and to spray this onto the surface of the parts of the carbon mold member to be protected. Finally, a further technique which is preferably used, is to immerse the carbon mold members to be protected in the protective melt provided for the separating layer, or if the carbon mold members are to be protected inside, to fill them with protective melt and subsequently pour this out again. The carbon mold members to be protected are advantageously left in the melt for several minutes, approximately 5 to 15 minutes usually being sufficient, before removing them from the melt or, in the case of curved carbon mold members that are to be protected on the inside, before the melt is poured out again. An additional factor that must be taken into account here is whether the carbon mold members are cold or hot when they are immersed in, or filled with, the melt. The application time is required in order to allow the protective melt to attach itself to the surface of the carbon mold member to be protected; a uniform wetting of the protective layer and the carbon again being absolutely necessary.

After the surplus protective melt has been drained off, a thin layer remains adhering to the carbon articles. The thickness of the layer is determined by the viscosity of the protective melt and this, in turn, can be regulated by the composition and temperature. For example, the viscosity of the mixed melt of calcium fluoride/calcium silicate may be reduced by increasing the proportion of calcium fluoride. For example, mixtures of calcium fluoride with calcium silicate containing 40 to 70 mole % of calcium silicate are ideally suitable.

Carbon bodies that may be protected in this manner are, for example, melting crucibles, casting molds, displacers, pipes, overflow channels, gas puddling lances, stirring and ladling tools, resistance heaters and slit-shaped nozzles for band-drawing.

If a protective layer composition having a very low melting point is selected, that is to say, for example, solely fluoride melts or fluoride rich silicate melts, the layer remains as a liquid separating layer between the silicon crystal and the carbon body for a long time during the cooling process after the silicon has solidified. The correlation between the melting point and the proportion of the components in the mixture may be taken from the phase diagrams (see, for example, J. Mukerji "Phase Equilibrium Diagram", *Journal of the American Ceramic Soc.* 48, 210 (1965). Protective layers having a low melting point are accordingly, for example, mixtures of calcium silicate with approximately 40 mole % of calcium fluoride, the melting point of which is about 300° C. below that of silicon. The melting point of, for example, a mixture of calcium fluoride with 45 mole % of magnesium fluoride is even lower (950° C.).

The liquid protective layer prevents the solidifying silicon from adhering to the carbon bodies, allows displacement and thus reduces mechanical stresses. Furthermore, this makes it possible to separate the solidified silicon from the carbon mold components without difficulty. Low-melting liquid separating layers of this type may be used, for example, in the crystallization of silicon in conical carbon crucibles. In this case, the crucible is no longer fractured by the expansion of the silicon as it solidifies. Also, the coarse-grained crystallization of silicon can be achieved in this manner, since the liquid separating layer prevents induced nucleation on the solid carbon wall and the crystallization can be initiated as slowly as desired without risk of the silicon reacting with the crucible. Also graphite casting molds, such as those used for the manufacture of polycrystalline base material for solar cells, may be advantageously used with a liquid separating layer of this type, as the silicon plates cast in them have a coarser crystalline structure that is favorable for the efficiency of the future solar cells. Moreover, after solidifying, while the separating layer is still liquid, the silicon plates can be removed from the casting mold so that the mold remains intact and can be prepared for a second casting operation. For the manufacture of more complicated silicon shaped articles, multi-component graphite molds may be used with the liquid separating layer according to the invention, which molds can be removed intact from the shaped silicon body after the silicon has solidified but before the liquid separating layer has hardened.

The invention makes it possible to use carbon bodies protected in this manner several times, it being advantageous to renew the protective separating layer from time to time.

In the following, a number of examples are given which serve to illustrate the invention in further detail, but which are not given by way of limitation.

EXAMPLE 1

A separating layer according to the invention was applied to a graphite crucible externally shaped as a cylinder having a diameter of 90 mm and a height of 90 mm and provided with a bore having a semispherical base with a diameter of 70 mm, and tapering outwards slightly towards the top at an angle of approximately 3°, with a total depth of 75 mm. For this purpose, it was filled with a protective melt consisting of 30% by weight of calcium fluoride and approximately 70% by weight of magnesium silicate (30% by weight of $CaF_2$ + 35% by weight of $MgO$ + 35% by weight of $SiO_2$) and 3% by weight of silicon powder, and left for 10 minutes at a temperature of approximately 1400° C. After subsequently pouring out the protective melt, a separating layer approximately 0.1 mm thick remined on the surface to be protected.

400 g of silicon were then melted by high-frequency heating in the crucible that had been coated in this manner and, by lowering the crucible out of the high frequency coil, crystallization proceeding from the bottom to the top was effected in the solidifying silicon. The silicon crystal solidified in a controlled manner was removed from the crucible at a temperature of approximately 1250° C. by simply turning over the crucible. The separating layer was still liquid at this temperature and the graphite crucible remained undamaged and could be used without after-treatment for a fresh melting process of silicon with subsequent solidification.

EXAMPLE 2

A cubic two-piece casting mold of graphite with dimensions of 100×100×100 mm and a wall thickness of 40 mm, divided in the middle and having a filling opening in one of the cube faces, was immersed for 10 minutes at approximately 1400° C. in a melt consisting of 40% by weight of calcium fluoride and approximately 60% by weight of calcium silicate (40% by weight of $CaF_2$ + 30% by weight of CaO + 30% by weight of $SiO_2$) to which 3% of silicon powder had been added in order to wet the graphite. After the casting mold has been taken out of the melt, a separating layer of approximately 0.1 mm remained on each face of the cube. 1500 g of silicon were melted in a graphite crucible that had been protected with the same separating layer by immersing in the same melt, and were then poured into the coated casting mold. The solidified cast silicon block was removed from the casting mold at a temperature of approximately 1200° C. by simply separating the two parts of the mold.

By coating on all sides, which was achieved by immersing the casting mold and the melting crucible in the calcium fluoride/calcium silicate melt, it was possible to operate in an oxidizing atmosphere (air) without an undesired burning off of the graphite.

EXAMPLE 3

Exactly the same procedure was carried out as in Example 2, except that a melt bath consisting of 55% by weight of calcium fluoride and 45% by weight of magnesium fluoride was used. The solidified cast silicon block was removed from the casting mold by separting the two parts of the mold at a temperature of approximately 1050° C., that is to say, at a temperature at which the separating layer was still liquid. In this case too, the casting mold and the melting crucible remained undamaged and could be reused without after-treatment.

Thus, while only several embodiments of the present invention have been described, it will be obvious to those persons of ordinary skill in the art, that many changes and modifications may be made thereunto, without departing from the spirit and scope of the invention.

What is claimed is:

1. In a process for protecting carbon bodies against attack by molten silicon comprising the step of:
    applying to the surface of the carbon body to be protected a separating protective layer comprising alkaline earth metal fluorides in admixture with 0 to 90 mole % of alkaline earth metal silicates have a melting point lower than that of silicon, said layer being applied in a manner which results in the wetting of the surface of said carbon body.

2. The process according to claim 1, wherein a mixture of calcium fluoride and calcium silicate is applied as the separating layer.

3. The process according to claim 1, wherein a mixture of calcium fluoride with 40 to 70 mole % of calcium silicate is applied.

4. The process according to claim 1, wherein 2 to 5% by weight of silicon is added to the mixture used as the separating layer in order to improve wetting.

5. The process according to claim 1, wherein said separating protective layer is applied by briefly immersing the carbon body in the molten mixture of alkaline earth metal fluorides and alkaline earth metal silicates.

* * * * *